(12) United States Patent
Arai et al.

(10) Patent No.: US 10,456,872 B2
(45) Date of Patent: *Oct. 29, 2019

(54) LEAD-FREE SOLDER ALLOY, ELECTRONIC CIRCUIT SUBSTRATE, AND ELECTRONIC DEVICE

(71) Applicant: TAMURA CORPORATION, Tokyo (JP)

(72) Inventors: Masaya Arai, Iruma (JP); Takeshi Nakano, Iruma (JP); Atsushi Hori, Iruma (JP); Tsukasa Katsuyama, Iruma (JP); Yurika Munekawa, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,650

(22) Filed: Sep. 8, 2017

(65) Prior Publication Data

US 2019/0076965 A1    Mar. 14, 2019

(51) Int. Cl.
| B23K 35/26 | (2006.01) |
| C22C 13/00 | (2006.01) |
| H05K 3/34 | (2006.01) |
| C22C 13/02 | (2006.01) |

(52) U.S. Cl.
CPC ............ *B23K 35/262* (2013.01); *B23K 35/26* (2013.01); *C22C 13/00* (2013.01); *C22C 13/02* (2013.01); *H05K 3/3457* (2013.01)

(58) Field of Classification Search
CPC ...... B23K 35/262; B23K 35/26; C22C 13/00; C22C 13/02

USPC ......................................................... 420/561
See application file for complete search history.

(56) References Cited

U.S. PATENT DOCUMENTS

| 2003/0021718 | A1 | 1/2003 | Munekata et al. |
| 2003/0168123 | A1 | 9/2003 | Wada et al. |
| 2007/0036671 | A1 | 2/2007 | Albrecht et al. |
| 2014/0054766 | A1* | 2/2014 | Hashino ............ H01L 23/49866 257/737 |
| 2015/0305167 | A1 | 10/2015 | Nakanishi et al. |
| 2016/0056570 | A1 | 2/2016 | Yoshikawa et al. |
| 2016/0279741 | A1* | 9/2016 | Ukyo ................... B23K 35/262 |
| 2016/0325384 | A1 | 11/2016 | Liu et al. |
| 2016/0368104 | A1 | 12/2016 | Irisawa et al. |
| 2017/0014955 | A1* | 1/2017 | Ueshima .............. B23K 35/262 |

FOREIGN PATENT DOCUMENTS

| CN | 101801589 | 8/2010 |
| CN | 104870673 | 8/2015 |
| CN | 105142856 | 12/2015 |

(Continued)

OTHER PUBLICATIONS

Written Opinion for corresponding International Application No. PCT/JP2017/033364, dated Dec. 12, 2017.

(Continued)

*Primary Examiner* — Brian D Walck
(74) *Attorney, Agent, or Firm* — Mori & Ward, LLP (57) ABSTRACT

A lead-free solder alloy includes 1% by weight or more and 4% by weight or less of Ag, 1% by weight or less of Cu, 3% by weight or more and 5% by weight or less of Sb, 0.01% by weight or more and 0.25% by weight or less of Ni, and Sn.

11 Claims, 3 Drawing Sheets

(56) References Cited

FOREIGN PATENT DOCUMENTS

| EP | 2578350 | 4/2013 | | |
|---|---|---|---|---|
| EP | 2689885 | 1/2014 | | |
| EP | 2868424 | 5/2015 | | |
| EP | 2875898 | 5/2015 | | |
| JP | 05-228685 | 9/1993 | | |
| JP | 09-326554 | 12/1997 | | |
| JP | 10-286689 | 10/1998 | | |
| JP | 3353640 B2 | 10/1998 | | |
| JP | 2000-190090 | 7/2000 | | |
| JP | 2000-349433 | 12/2000 | | |
| JP | 2003-260589 | 9/2003 | | |
| JP | 2008-028413 | 2/2008 | | |
| JP | WO2009/011341 | 1/2009 | | |
| JP | 2009-028746 | 2/2009 | | |
| JP | 4787384 B1 | 10/2011 | | |
| JP | WO2011/151894 | 12/2011 | | |
| JP | 2012-081521 | 4/2012 | | |
| JP | 2012-106280 | 6/2012 | | |
| JP | 5324007 B1 | 10/2013 | | |
| JP | 2013-252548 | 12/2013 | | |
| JP | 2014-027122 | 2/2014 | | |
| JP | 2014-36985 | 2/2014 | | |
| JP | 2014-037005 | 2/2014 | | |
| JP | 2014-54663 | 3/2014 | | |
| JP | 2014-65065 | 4/2014 | | |
| JP | 2015-077601 | 4/2015 | | |
| JP | WO2015/125855 | 8/2015 | | |
| JP | 2016-026879 | 2/2016 | | |
| JP | 2016-179498 | 10/2016 | | |
| JP | 6200534 B2 | 10/2016 | | |
| JP | 6047254 B1 | 12/2016 | | |
| JP | 6053248 B1 | 12/2016 | | |
| JP | 2017-143196 | 8/2017 | | |
| JP | 2017-170465 | 9/2017 | | |
| JP | 2018-030176 | 3/2018 | | |
| WO | WO 2011/102034 | 8/2011 | | |
| WO | WO 2014/163167 | 10/2014 | | |
| WO | WO 2015/115483 | 8/2015 | | |
| WO | WO 2015/152387 | 10/2015 | | |
| WO | WO-2015152387 A1 * | 10/2015 | .......... | B23K 35/262 |
| WO | WO 2017/018167 | 2/2017 | | |

OTHER PUBLICATIONS

Japanese Office Action for JP Application No. 2016-057713, dated Sep. 26, 2017 (w/ English machine translation).
Unpublished JP Application No. 2015-146520 filed in JPO on Jul. 24, 2015.
Japanese Office Action for corresponding JP Application No. 2016-057712, dated Jul. 15, 2016 (w/ English machine translation).
Japanese Office Action for corresponding JP Application No. 2016-182809, dated Jun. 1, 2017 (w/ English machine translation).
Japanese Office Action for corresponding JP Application No. 2016-224592, dated Feb. 3, 2017 (w/ English machine translation).
Japanese Office Action for corresponding JP Application No. 2017-073646, dated Jun. 1, 2017 (w/ English machine translation).
Japanese Office Action for corresponding JP Application No. 2017-073646, dated Jul. 20, 2017 (w/ English machine translation).
Written Patent Opposition to JP Application No. 6047254, dated Jun. 19, 2017 (w/ English translation).
International Search Report for corresponding International Application No. PCT/JP2017/011284, dated Jun. 20, 2017.
Japanese Office Action for JP Application No. 2017-199948, dated Nov. 7, 2017 (w/ English machine translation).
Notice of Reasons for Revocation of Patent issued by the Japan Patent Office for corresponding JP Patent No. 6047254 (Opposition No. 2017-700619), dated Sep. 22, 2017.
Written Patent Opposition filed in the corresponding JP Patent No. 6125084, dated Nov. 8, 2017.
Notice of Reasons for Revocation of Patent issued by the Japan Patent Office for corresponding JP Patent No. 6125084 (Opposition No. 2017-701039), dated Jan. 19, 2018.
Korean Office Action for corresponding KR Application No. 10-2018-7000900, dated Apr. 11, 2018.
Japanese Office Action for corresponding JP Application No. 2016-038976, dated Jan. 19, 2017.
Japanese Office Action for corresponding JP Application No. 2016-038976, dated Apr. 25, 2017.
Office Action issued by the United States Patent and Trademark Office for the co-pending U.S. Appl. No. 15/073,570, dated Apr. 2, 2018.
Extended European Search Report for corresponding EP Application No. 17770236.2-1103, dated Jul. 20, 2018.
Translation of Written Opinion of the International Searching Authority for corresponding International Application No. PCT/JP2017/011284, dated Jun. 20, 2017.
Chinese Office Action for corresponding CN Application No. 201610154029.4, dated Dec. 3, 2018.
Li et al., "Effect of the microelements on the oxidation-resistance of Sn-0.7Cu lead-free solder", Electronic Components and Materials, Nov. 2017, vol. 26 No. 11.
Chinese Office Action for corresponding CN Application No. 201810286715.6, dated Dec. 5, 2018.
Japanese Office Action for corresponding JP Application No. 2017-015245, dated Jan. 29, 2019 (w/ machine translation).
International Search Report for corresponding International Application No. PCT/JP2017/033364, dated Dec. 12, 2017.
Submission of publication etc. for corresponding JP Application No. 2016-038976, dated Jan. 26, 2017.
Japanese Office Action for corresponding JP Application No. 2017-199949, dated Aug. 30, 2018.
Japanese Office Action for corresponding JP Application No. 2017-015245, dated Sep. 10, 2018.
Japanese Office Action for corresponding JP Application No. 2017-201023, dated Aug. 29, 2018.
Communication Pursuant to Rule 114(2) EPC for corresponding EP Application No. 17770236.2-1103, dated Oct. 5, 2018.
Office Action issued by the United States Patent and Trademark Office for the co-pending U.S. Appl. No. 15/073,570, dated Sep. 13, 2018.
Advisory Action issued by the United States Patent and Trademark Office for the co-pending U.S. Appl. No. 15/073,570, dated Nov. 23, 2018.
Third Party Observation for corresponding International Application No. PCT/JP2017/011284, dated Oct. 25, 2017.
Office Action with Form PTO-892 Notice of References Cited issued by the U.S. Patent and Trademark Office for the co-pending U.S. Appl. No. 15/073,570, dated Mar. 11, 2019.
Communication Pursuant to Article 94(3) EPC for corresponding EP Application No. 1777.236.2-1103, dated Feb. 11, 2019.
Chinese Office Action with Search Report for corresponding CN Application No. 201780001047.1, dated Mar. 1, 2019.
Yang et al., "Electronic Process Basics and Practices", Nov. 30, 2012, pp. 147-148, South China University of Technology Press, See Cite No. 3 (w/ partial English translation).
Translation of Written Opinion of the International Searching Authority for corresponding International Application No. PCT/JP2017/033364, dated Feb. 22, 2019.
Chinese Office Action for corresponding CN Application No. 201810286715.6, dated May 8, 2019.
European Patent Office Communication for corresponding EP Application No. 17770236.2-1103, dated Jun. 3, 2019.
Korean Office Action for corresponding KR Application No. 10-2018-7000028, dated Jun. 5, 2019 (w/ machine translation).
Extended European Search Report for corresponding EP Application No. 17910490.6-1108, dated Jul. 24, 2019.
Chinese Office Action for corresponding CN Application No. 201610154029.4, dated Jul. 5, 2019.
Office Action with Form PTO-892 Notice of References Cited issued by the United States Patent and Trademark Office for the co-pending U.S. Appl. No. 15/073,570, dated Sep. 6, 2019.

(56) References Cited

OTHER PUBLICATIONS

Office Action with Form PTO-892 Notice of Reference Cited issued by the United States Patent and Trademark Office for the co-pending U.S. Appl. No. 15/709,424, dated Sep. 6, 2019.

* cited by examiner

LEAD-FREE SOLDER ALLOY, ELECTRONIC CIRCUIT SUBSTRATE, AND ELECTRONIC DEVICE

BACKGROUND OF THE INVENTION

Field of the Invention

The present disclosure relates to a lead-free solder alloy, an electronic circuit substrate, and an electronic device.

Discussion of the Background

In the related art, when joining an electronic component to an electronic circuit that is formed on a substrate such as a printed circuit board and silicon wafer, a solder-joining method that uses a solder alloy has been employed. In the solder alloy, lead is typically used. However, use of lead is limited in accordance with RoHS command from the viewpoint of an environmental load. Accordingly, in recent, a solder-joining method with a so-called lead-free solder alloy, which does not contain lead, is generally used.

As the lead-free solder alloy, for example, a Sn—Cu-based solder alloy, a Sn—Ag—Cu-based solder alloy, a Sn—Bi-based solder alloy, a Sn—Zn-based solder alloy, and the like are well known. Among these, in a consumer electronic device that is used in a television, a portable telephone, and the like, and an in-vehicle electronic device that is mounted on a vehicle, Sn-3Ag-0.5Cu solder alloy is widely used.

Solderability of the lead-free solder alloy is slightly inferior to that of a lead-containing solder alloy, but a problem related to the solderability is covered through an improvement of flux or a soldering apparatus. Accordingly, for example, even in the in-vehicle electronic circuit substrate, when the in-vehicle electronic circuit substrate is placed in a relatively warm environment such as a vehicle interior of a vehicle even though a temperature difference is present therein, a significant problem does not occur even in a solder joint that is formed by using the Sn-3Ag-0.5Cu solder alloy.

However, in recent, under a harsh environment such as an engine compartment, direct placing of an engine, and electric/mechanical integration with a motor in which the temperature difference is particularly significant (for example, a temperature difference from −30° C. to 110° C., a temperature difference from −40° C. to 125° C., and a temperature difference from −40° C. to 150° C.), and an vibration load is applied, disposition examination and practical application of an electronic circuit substrate such as an electronic circuit substrate used in an electronic device have been made. In the environment in which the temperature different is very significant, thermal displacement of a solder joint due to a difference in a linear expansion coefficient between an electronic component that is mounted and the substrate, and a stress accompanying the thermal displacement are likely to occur. In addition, repetition of plastic deformation due to the temperature difference is likely to cause a crack in a solder joint, and a stress that is repetitively applied with the passage of time is concentrated to the vicinity of a tip end of the crack, and thus the crack is likely to propagate to a deep portion of the solder joint in a transverse direction. The crack, which significantly propagates as described above, is apt to cause disconnection of electrical connection between the electronic component and an electronic circuit that is formed on the substrate. Particularly, in an environment in which vibration is loaded on the electronic circuit substrate in addition to a great temperature difference, the crack and the propagation thereof are more likely to occur.

Therefore, during an increase of the in-vehicle electronic circuit substrate and the electronic device which are placed in the above-described harsh environment, it is expected that a demand for the Sn—Ag—Cu-based solder alloy capable of exhibiting a sufficient crack propagation suppressing effect increases from now on.

In addition, in the related art, a Ni/Pd/Au-plated component or a Ni/Au-plated component has been widely used in a lead portion of an electronic component such as a quad flat package (QFP) and a small outline package (SOP) which are mounted on the in-vehicle electronic circuit substrate. However, recently, along with a reduction in the cost of the electronic component or substrate downsizing, an electronic component in which the lead portion is substituted with Sn plating or an electronic component including a Sn-plated lower surface electrode has been examined and put into practical use.

During solder-joining, the Sn-plated electronic component is likely to cause mutual diffusion between Sn included in the Sn plating and the solder joint and Cu included in the lead portion or the lower surface electrode. Due to the mutual diffusion, a $Cu_3Sn$ layer, which is an intermetallic compound, is greatly grown in a concavo-convex shape in a region (hereinafter, referred to as "vicinity of an interface" in this specification) in the vicinity of an interface between the solder joint, and the lead portion or the lower surface electrode. The $Cu_3Sn$ layer has hard and brittle properties, and thus the $Cu_3Sn$ layer that is greatly grown in the concavo-convex shape becomes more brittle. Accordingly, under the above-described harsh environment, a crack is more likely to occur in the vicinity of the interface in comparison to the solder joint, and crack propagation instantaneously occurs from the crack that is the origin. Accordingly, electrical short-circuiting is likely to occur.

Accordingly, even in a case of using the electronic component that is not subjected to the Ni/Pd/Au plating or the Ni/Au plating under the harsh environment, it is expected that a demand for the lead-free solder alloy, which is capable of exhibiting the crack propagation suppressing effect in the vicinity of the interface, increases.

Until now, there are disclosed various methods in which an element such as Ag and Bi is added to the Sn—Ag—Cu-based alloy so as to improve strength of the solder joint and thermal fatigue characteristics, thereby suppressing crack propagation in the solder joint (refer to JP 5-228685 A, JP 9-326554 A, JP 2000-190090 A, JP 2000-349433 A, JP 2008-28413 A, WO 2009/011341 A, and JP 2012-81521 A).

SUMMARY

According to one aspect of the invention, a lead-free solder alloy includes 1% by weight or more and 4% by weight or less of Ag, 1% by weight or less of Cu, 3% by weight or more and 5% by weight or less of Sb, 0.01% by weight or more and 0.25% by weight or less of Ni, and Sn.

According to another aspect of the invention, an electronic circuit substrate includes a solder joint. The solder joint is to joint an electronic component with a lead-free solder alloy. The lead-free solder alloy includes 1% by weight or more 4% by weight or less of Ag, 1% by weight or less of Cu, 3% by weight or more and 5% by weight or less of Sb, 0.01% by weight or more and 0.25% by weight or less of Ni, and Sn.

According to further aspect of the invention, an electronic device includes an electronic component and an electronic circuit substrate. The electronic circuit substrate includes a solder joint that joints the electronic component with a lead-free solder alloy. The lead-free solder alloy includes 1% by weight or more and 4% by weight or less of Ag, 1% by weight or less of Cu, 3% by weight or more and 5% by weight or less of Sb, 0.01% by weight or more and 0.25% by weight or less of Ni, and Sn.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

The embodiments will now be described with reference to the accompanying drawings, wherein like reference numerals designate corresponding or identical elements throughout the various drawings.

Hereinafter, description will be given of an embodiment of a lead-free solder alloy, an electronic circuit substrate, and an electronic device. Note that the invention is not limited to the following embodiments.

(1) Lead-Free Solder Alloy

The lead-free solder alloy of this embodiment may contain 1% by weight or more and 4% or less by weight of Ag. When Ag is added, a $Ag_3Sn$ compound is allowed to precipitate to a Sn grain boundary of the lead-free solder alloy, and thus mechanical strength can be applied thereto.

However, in a case where the amount of Ag is less than 1% by weight, precipitation of the $Ag_3Sn$ compound is less likely to occur, and mechanical strength and thermal shock resistance of the lead-free solder alloy deteriorate, and thus this case is not preferable. In addition, in a case where the amount of Ag is greater than 4% by weight, a stretching property of the lead-free solder alloy deteriorates, and there is a concern that a solder joint formed by using the lead-free solder alloy may cause an electrode peeling-off phenomenon in an electronic component, and thus this case is not preferable.

In addition, in a case where the amount of Ag is set to 2% by weight or more and 3.8% by weight or less, it is possible to obtain more satisfactory balance between the strength and the stretching property of the lead-free solder alloy. The amount of Ag is more preferably 2.5% by weight or more and 3.8% by weight or less.

The lead-free solder alloy of this embodiment can contain 1% by weight or less of Cu. When Cu is added in this range, a Cu leaching prevention effect with respect to a Cu land of an electronic circuit is exhibited, and the $Cu_6Sn_5$ compound is allowed to precipitate to the Sn grain boundary. As a result, it is possible to improve the thermal shock resistance of the lead-free solder alloy.

Furthermore, when the amount of Cu is set to 0.5% by weight or more and 1% by weight or less, satisfactory Cu leaching prevention effect can be exhibited. Particularly, in a case where the amount of Cu is 0.7% by weight or less, the Cu leaching prevention effect with respect to Cu land can be exhibited. In addition, the viscosity of the lead-free solder alloy in melting can be maintained to a satisfactory state, and occurrence of voids in reflow is suppressed. As a result, it is possible to improve the thermal shock resistance of the solder joint that is formed. Furthermore, minute $Cu_6Sn_5$ is dispersed to the Sn grain boundary of the lead-free solder alloy that is melted, and a crystal orientation of Sn is suppressed from being changed. As a result, it is possible to suppress deformation of a solder joint shape (fillet shape).

Furthermore, in a case where the amount of Cu is greater than 1% by weight, there is a concern that a $Cu_6Sn_5$ compound is likely to precipitate to the vicinity of an interface between an electronic component of the solder joint and the electronic circuit substrate, and joining reliability and the stretching property of the solder joint may deteriorate. Therefore, this case is not preferable.

The lead-free solder alloy of this embodiment may contain 3% by weight or more and 5% by weight or less of Sb. When Sb is added in this range, it is possible to improve the crack propagation suppressing effect in the solder joint without deteriorating the stretching property of the Sn—Ag—Cu-based solder alloy. When the amount of Sb is set to 3% by weight or more and 5% by weight or less, and more preferably 3.5% by weight or more and 5% by weight or less, it is possible to further improve the crack propagation suppressing effect.

Here, so as to endure against an external stress when being exposed to a harsh environment, in which the temperature difference is significant, for a long period of time, it is considered that it is effective to make the stretching property be satisfactory by increasing toughness (the size of an area surrounded by a stress-strain line) of the lead-free solder alloy, and to add an element, which forms a solid-solution in the Sn matrix, for solid-solution strengthening. In addition, Sb is an optimal element to realize the solid-solution strengthening of the lead-free solder alloy while securing the toughness and strengthening property to a sufficient extent.

That is, when the above-described range of Sb is substantially added to the lead-free solder alloy in which Sn is set as a base material (in this specification, the base material represents an important constituent element of the lead-free solder alloy. The same shall apply hereinafter), a part of a crystal lattice of Sn is substituted with Sb, and thus deformation occurs in the crystal lattice. Accordingly, in the solder joint that is formed by using the lead-free solder alloy, energy necessary for transition in the crystal increases when a part of the Sn crystal lattice is substituted with Sb, and thus the metallic structure is strengthened. Furthermore, minute SnSb and $\varepsilon$-$Ag_3$ (Sn, Sb) compounds precipitate to the Sn grain boundary, and thus sliding deformation of the Sn grain boundary is prevented. As a result, it is possible to suppress propagation of a crack that occurs in the solder joint.

In addition, it is confirmed that in the structure of the solder joint formed by using the lead-free solder alloy to which Sb is added in the above-described range, even after being exposed to a harsh environment in which the temperature difference is significant for a long period of time, a Sn crystal secures a further minute state in comparison to the Sn-3Ag-0.5Cu solder alloy, and thus a crack is less likely to propagate. The reason for this is considered as follows. Even after the SnSb and $\varepsilon$-$Ag_3$ (Sn, Sb) compounds, which precipitate to the Sn grain boundary, are exposed to the harsh environment in which the temperature difference is significant for a long period of time, the compounds are minutely dispersed in the solder joint, and thus coarsening of the Sn crystal is suppressed. That is, in the solder joint that is formed by using the lead-free solder alloy to which Sb is added in the above-described range, solid-solution of Sb into the Sn matrix occurs in a high-temperature state, and precipitation of the SnSb and ε-$Ag_3$ (Sn, Sb) compounds occurs in a low-temperature state. Accordingly, even in a case of being exposed to the harsh environment in which the temperature difference is significant, a solid-solution strengthening process at a high temperature and a precipitation strengthening process at a low temperature are repeated, and thus it is considered that excellent thermal shock resistance can be secured.

In addition, it is possible to further improve the strength of the lead-free solder alloy to which Sb is added in the above-described range without deteriorating the stretching property in comparison to the Sn-3Ag-0.5Cu solder alloy. As a result, it is possible to secure sufficient toughness against an external stress, and it is also possible to mitigate a residual stress.

Here, in a case where a solder joint formed by using a solder alloy having a low stretching property is placed under the harsh environment in which the temperature difference is significant, a stress that repetitively occurs is likely to be accumulated on an electron component side of the solder joint. Accordingly, a crack at a deep portion frequently occurs in the solder joint in the vicinity of an electrode of an electronic component. As a result, the stress is concentrated to the electrode of the electronic component in the vicinity of the crack, and thus a phenomenon in which the solder joint peels off the electrode on the electronic component side may occur. However, in the solder alloy according to this embodiment, since Sb is added in the above-described range, even when containing an element such as Bi that has an effect on the stretching property of the solder alloy, the stretching property is less likely to deteriorate. In addition, even in a case of being exposed to the harsh environment as described above for a long period of time, the electrode peeling-off phenomenon in the electronic component can be suppressed.

Furthermore, in a case where the amount of Sb is less than 3%, energy necessary for transition in the crystal increases at a part of the Sn crystal lattice due to the substitution with Sb, and the metallic structure can be solid-solution strengthened, but minute compounds such as SnSb and ε-$Ag_3$ (Sn, Sb) cannot sufficiently precipitate to the Sn grain boundary. According to this, when a solder joint formed by using the solder alloy is exposed to the harsh environment in which the temperature difference is significant for a long period of time, the Sn crystal is coarsened, and thus the solder joint is changed into a structure in which a crack is likely to propagate. Accordingly, it is difficult for the solder joint to secure sufficient thermal fatigue resistance.

In addition, in a case where the amount of Sb is greater than 5% by weight, a melting temperature of the lead-free solder alloy is raised, and thus solid-solution of Sb does not occur again at a high temperature. Accordingly, in a case of being exposed to the harsh environment in which the temperature difference is significant for a long period of time, only the precipitation strengthening by the SnSb and ε-$Ag_3$ (Sn, Sb) compounds occurs, and thus the intermetallic compounds become coarsened with the passage of time. As a result, the sliding deformation suppressing effect in the Sn grain boundary is lost. In addition, in this case, a heat resisting temperature of the electronic component also becomes problematic due to the rising of the melting temperature of the lead-free solder alloy, and thus this case is not preferable.

According to the configuration of the lead-free solder alloy of this embodiment, even when the amount of Sb is set to 3% by weight or more and 5% by weight or less, excessive rising of the melting temperature of the lead-free solder alloy is suppressed, and satisfactory strength is given to a solder-joined body that is formed. Accordingly, in the lead-free solder alloy of this embodiment, even though Bi is not set as an essential composition, it is possible to sufficiently exhibit the crack propagation suppressing effect in the solder joint that is formed.

The lead-free solder alloy of this embodiment can contain 0.01% weight or more and 0.25% by weight or less of Ni. According to the configuration of the lead-free solder alloy of this embodiment, when Ni is added in the range, minute (Cu, Ni)$_6$Sn$_5$ is formed in the lead-free solder alloy that is melted, and is dispersed in a base material. Accordingly, propagation of a crack in the solder joint can be suppressed, and thermal fatigue resistance thereof can be improved.

In addition, even when the lead-free solder alloy of this embodiment is used to solder-join an electronic component that is not subjected to Ni/Pd/Au plating or Ni/Au plating, Ni moves to the vicinity of the interface during solder-joining and forms the minute (Cu, Ni)$_6$Sn$_5$. Accordingly, it is possible to suppress growth of the Cu$_3$Sn layer in the vicinity of the interface, and thus it is possible to improve the crack propagation suppressing effect in the vicinity of the interface.

However, in a case where the amount of Ni is less than 0.01% by weight, a modifying effect of the intermetallic compounds is not sufficient, and thus it is difficult to sufficiently obtain a crack suppressing effect in the vicinity of the interface. In addition, in a case where the amount of Ni is greater than 0.25% by weight, over-cooling is less likely to occur in comparison to the Sn-3Ag-0.5Cu alloy of the related art, and thus solidification timing of a solder alloy becomes earlier. According to this, in a fillet of a solder joint that is formed, it is confirmed that a gas, which tries to get out during melting of the solder alloy, remains in the fillet and is solidified as is, and voids occur in the fillet due to the gas in some cases. Particularly, the voids in the fillet are apt to deteriorate the thermal fatigue resistance of the solder joint under a harsh environment in which a temperature difference such as a temperature difference from −40° C. to 140° C. and a temperature difference from −40° C. to 150° C.

Furthermore, as described above, Ni is likely to cause voids in the fillet. However, in the configuration of the lead-free solder alloy of this embodiment, even when Ni is contained in an amount of 0.25% by weight or less, it is possible to suppress occurrence of the voids due to a balance in an amount between Ni and other elements.

In addition, when the amount of Ni is set to 0.01% by weight or more and 0.15% by weight or less, it is possible to improve the voids occurrence suppressing effect while improving the crack propagation suppressing effect in the vicinity of the interface and the thermal fatigue resistance.

The lead-free solder alloy of this embodiment may contain 0.001% by weight or more and 0.25% by weight or less of Co in addition to Ni. According to the configuration of the lead-free solder alloy of this embodiment, when Co is added in this range, the effect obtained due to addition of Ni is enhanced, and minute (Cu, Co)$_6$Sn$_5$ is formed in the lead-free solder alloy that is melted and is diffused in the base material, and thus it is possible to improve the thermal fatigue resistance of the solder joint even under the harsh environment in which the temperature difference is significant while suppressing creep deformation and crack propagation in the solder joint.

In addition, even when the lead-free solder alloy of this embodiment is used to solder-join an electronic component that is not subjected to Ni/Pd/Au plating or Ni/Au plating, the above-described effect obtained due to addition of Ni is enhanced, and Co moves to the vicinity of the interface during solder-joining to form minute $(Cu, Co)_6Sn_5$, and thus it is possible to suppress growth of the $Cu_3Sn$ layer in the vicinity of the interface and it is possible to improve the crack propagation suppressing effect in the vicinity of the interface.

However, when the amount of Co is less than 0.001% by weight, the above-described intermetallic compound modifying effect becomes not sufficient, and thus it is difficult to sufficiently obtain the crack suppressing effect in the vicinity of the interface. In addition, when the amount of Co is greater than 0.25% by weight, over-cooling is less likely to occur in comparison to the Sn-3Ag-0.5Cu alloy of the related art, and thus solidification timing of a solder alloy becomes earlier. Accordingly, in a fillet of a solder joint that is formed, it is confirmed that a gas, which tries to get out during melting of the solder alloy, remains in the fillet and is solidified as is, and voids occur in the fillet due to the gas in some cases. Particularly, the voids in the fillet deteriorate the thermal fatigue resistance of the solder joint under the harsh environment in which the temperature difference is significant.

Furthermore, as described above, Co is likely to cause voids in the fillet. However, in the configuration of the lead-free solder alloy of this embodiment, even when Co is contained in an amount of 0.25% by weight or less, it is possible to suppress occurrence of the voids due to a balance in an amount between Co and other elements.

In addition, when the amount of Co is set to 0.001% by weight or more and 0.15% by weight or less, it is possible to improve the void occurrence suppressing effect while improving the crack propagation suppressing effect in the vicinity of the interface and the thermal fatigue resistance.

Here, in a case of using Ni and Co in the lead-free solder alloy of this embodiment in combination with each other, it is preferable that the amount of Ag, Cu, Sb, Bi, Ni, and Co, in terms of % by weight, satisfies the entirety of the following Expressions (A) to (D).

$$1.6 \leq \text{the amount of Ag} + (\text{the amount of Cu}/0.5) \leq 5.4 \quad (A)$$

$$0.73 \leq (\text{the amount of Ag}/4) + (\text{the amount of Sb}/5) \leq 2.10 \quad (B)$$

$$1.1 \leq \text{the amount of Sb/the amount of Cu} \leq 11.9 \quad (C)$$

$$0 < (\text{the amount of Ni}/0.25) + (\text{the amount of Co}/0.25) \leq 1.19 \quad (D)$$

When the amount of Ag, Cu, Sb, Ni, and Co is set in the above-described ranges, even though Bi is not set as an essential composition, it is possible to exhibit the entirety of suppression of deterioration of the stretching property and increase in brittleness of the solder joint, an improvement of the strength and the thermal fatigue resistance of the solder joint, suppression of voids that occur in the fillet, suppression of crack propagation in the solder joint under the harsh environment in which the temperature difference is significant, and the crack propagation suppression effect in the vicinity of the interface during solder-joining of an electronic component that is not subjected to Ni/Pd/Au plating or Ni/Au plating with good balance. As a result, it is possible to further improve reliability of the solder joint.

In addition, the lead-free solder alloy of this embodiment may contain 6% by weight or less of In. When In is added in this range, the melting temperature of the lead-free solder alloy, which is raised due to addition of Sb, is lowered, and it is possible to improve the crack propagation suppressing effect. That is, as is the case with Sb, In forms a solid-solution in the Sn matrix, it is possible to further strengthen the lead-free solder alloy. In addition, a AgSnIn compound and an InSb compound are formed, and these compounds precipitate to the Sn grain boundary. As a result, it is possible to obtain an effect of suppressing the sliding deformation of the Sn grain boundary.

In a case where the amount of In that is added to the solder alloy of the embodiment is greater than 6% by weight, the stretching property of the lead-free solder alloy deteriorates, and $\gamma$-$InSn_4$ is formed during exposure to the harsh environment in which the temperature difference is significant for a long time, and thus the lead-free solder alloy is self-deformed. Accordingly, this case is not preferable.

Furthermore, the amount of In is preferably 4% by weight or less, and more preferably 1% by weight or more and 2% by weight or less.

In addition, the lead-free solder alloy of this embodiment may contain at least one kind of P, Ga, and Ge in an amount of 0.001% by weight or more and 0.05% by weight or less. When at least one kind of P, Ga, and Ge is added in this range, it is possible to prevent oxidation of the lead-free solder alloy. However, in a case where the amount of the elements is greater than 0.05% by weight, the melting temperature of the lead-free solder alloy is raised, and voids are likely to occur in the solder joint. Therefore, this case is not preferable.

In addition, the lead-free solder alloy of this embodiment may contain at least one kind of Fe, Mn, Cr, and Mo in an amount of 0.001% by weight or more and 0.05% by weight or less. When at least one kind of Fe, Mn, Cr, and Mo is added in this range, it is possible to improve the crack propagation suppressing effect of the lead-free solder alloy. However, in a case where the amount of the elements is greater than 0.05% by weight, the melting temperature of the lead-free solder alloy is raised, and voids are likely to occur in the solder joint. Therefore, this case is not preferable.

Furthermore, the lead-free solder alloy of this embodiment may contain other components (elements) such as Cd, Tl, Se, Au, Ti, Si, Al, Mg, Zn, and Bi in a range not deteriorating the effect. In addition, unavoidable impurities may be contained in the lead-free solder alloy of this embodiment.

In addition, it is preferable that the balance of the lead-free solder alloy of this embodiment includes Sn. Furthermore, the amount of Sn is preferably equal to or greater than 83.4% and less than 95.99% by weight.

For example, the solder joint of this embodiment may be formed by using an arbitrary method capable of forming the solder joint such as a flow method, mounting by a solder ball, and a reflow method using a solder paste composition. Furthermore, among the methods, the reflow method using the solder paste composition is particularly preferably used.

(2) Solder Paste Composition

For example, the solder paste composition is prepared by kneading the lead-free solder alloy having a powder shape, and flux into a paste shape.

As the flux, for example, flux including a resin, a thixo agent, an activating agent, and a solvent is used.

Examples of the resin include rosin-based resins including rosin such as tall oil rosin, gum rosin, and wood rosin, rosin derivatives such as hydrogenated rosin, polymerized rosin, heterogenized rosin, acrylic acid modified rosin, and maleic acid modified rosin; acrylic resins obtained by polymerizing at least one kind of monomer such as acrylic acid, methacrylic acid, various esters of acrylic acid, various esters of methacrylic acid, crotonic acid, itaconic acid, maleic acid, maleic anhydride, esters of maleic acid, esters of maleic anhydride, acrylonitrile, methacrylonitrile, acrylamide, methacrylamide, vinyl chloride, and vinyl acetate; an epoxy resin; a phenol resin; and the like. These resins may be used alone or in combination of a plurality of the resins.

Among the resins, the rosin-based resins, particularly, hydrogenated acid-modified rosin in which hydrogen is added to acid-modified rosin is preferably used. In addition, the hydrogenated acid-modified rosin and the acrylic resin are also preferably used in combination.

An acid value of the resin is preferably 10 mgKOH/g to 250 mgKOH/g, and a blending amount of the resin is preferably 10% by weight or more and 90% by weight or less with respect to the total amount of the flux.

Examples of the thixo agent include Hydrogenated castor oil, fatty acid amides, oxy fatty acids, and the like. These may be used alone or in combination of a plurality of thixo agents. A blending amount of the thixo agent is preferably 3% by weight or more and 15% by weight or less with respect to the total amount of the flux.

As the activating agent, for example, an amine salt (an inorganic acid salt or an organic acid salt) such as a hydrogen halide salt of an organic amine, an organic acid, an organic acid salt, and an organic amine salt may be blended. More specific examples of the activating agent include diphenylguanidine hydrobromate, cyclohexylamine hydrobromate, a diethylamine salt, an acid salt, succinic acid, adipic acid, sebacic acid, and the like. These may be used along or in combination of a plurality of the activating agents. A blending amount of the activating agent is preferably 5% by weight or more and 15% by weight or less with respect to the total amount of the flux.

As the solvent, for example, Isopropyl alcohol, ethanol, acetone, toluene, xylene, ethyl acetate, ethyl cellosolve, butyl cellosolve, glycol ether, and the like can be used. These may be used alone or in combination of a plurality of the solvents. A blending amount of the solvent is preferably 20% by weight or more and 40% by weight or less with respect to the total amount of the flux.

An antioxidant may be blended to the flux so as to suppress oxidization of the lead-free solder alloy. Examples of the antioxidant include a hindered phenol-based antioxidant, a phenol-based antioxidant, a bisphenol-based antioxidant, a polymer type antioxidant, and the like. Among these, particularly, the hindered phenol-based antioxidant is preferably used. These may be used along or in combination of a plurality of the antioxidants. Although not particularly limited, typically, a blending amount of the antioxidant is preferably 0.5% by weight or more and 5% by weight or less with respect to the total amount of the flux.

Other resins, and an additive such as halogen, a delustering agent, and antifoaming agent, and inorganic filler may be added to the flux.

A blending amount of the additive is preferably 10% by weight or less with respect to the total amount of the flux. In addition, the blending amount of the additive is more preferably 5% by weight or less with respect to the total amount of the flux.

It is preferable that a blending ratio between the lead-free solder alloy and the flux is 65:35 to 95:5 in a ratio of solder alloy:flux. The blending ratio is more preferably 85:15 to 93:7, and still more preferably 87:13 to 92:8.

(3) Electronic Circuit Substrate

Figure 1:
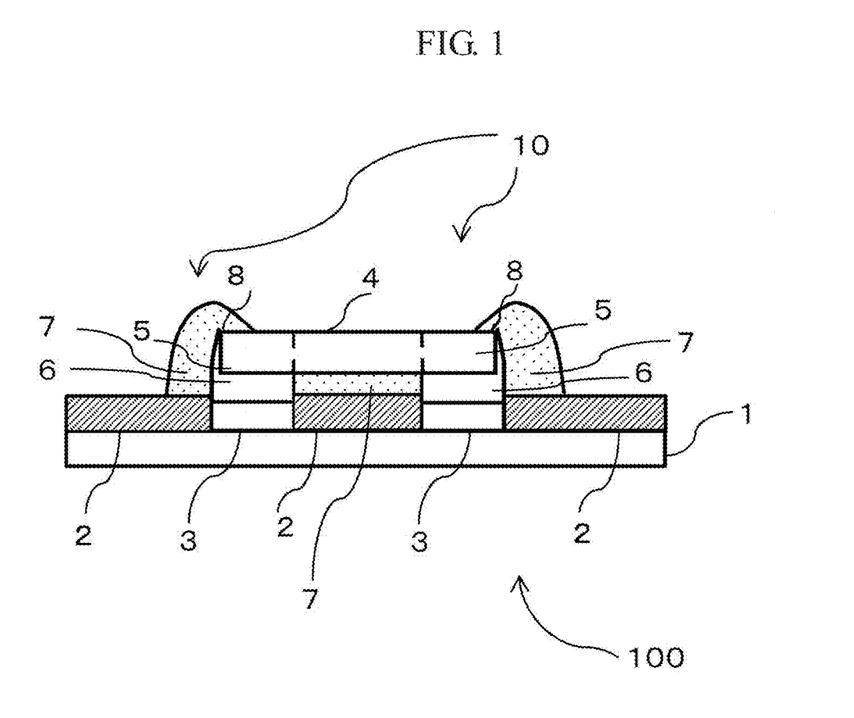
FIG. 1 is a partial cross-sectional view illustrating a part of an electronic circuit substrate according to an embodiment of the invention.
Figure 2:
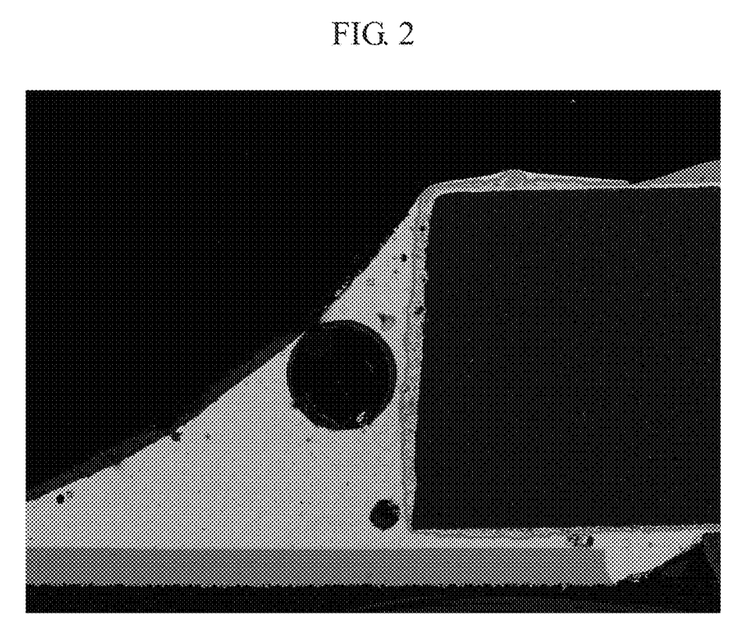
FIG. 2 is a an electron microscope photograph illustrating a cross-section in which voids occur in a fillet portion of a chip component in a test substrate according to a comparative example of the invention.

A configuration of the electronic circuit substrate of this embodiment will be described with reference to FIG. 1. An electronic circuit substrate 100 of this embodiment includes a substrate 1, an insulating layer 2, an electrode portion 3, and a solder-joined body 10. The solder-joined body 10 includes a solder joint 6 and a flux residue 7, and an electronic component 4 includes an external electrode 5 and an edge portion 8.

As the substrate 1, it is possible to use an arbitrary substrate such as a printed circuit board, silicon wafer, and a ceramic package substrate which are used in mounting of an electronic component without limitation to the substrate 1.

The electrode portion 3 is electrically joined to the external electrode 5 of the electronic component 4 with the solder joint 6 interposed therebetween.

In addition, the solder joint 6 is formed by using the solder alloy according to this embodiment.

In the electronic circuit substrate 100 having the above-described configuration according to this embodiment, the solder joint 6 has an alloy composition that exhibiting the crack propagation suppressing effect, and thus even in a case where a crack occurs in the solder joint 6, it is possible to suppress propagation of the crack. Particularly, even in a case where the electronic component 4 is not subjected to Ni/Pd/Au plating or Ni/Au plating, it is also possible to exhibit the crack propagation suppressing effect in the vicinity of the interface between the solder joint 6 and the electronic component 4. In addition, according to this, it is possible to suppress an electrode peeling-off phenomenon in the electronic component 4.

For example, the electronic circuit substrate 100 is prepared as follows.

First, on the substrate 1 including the insulating layer 2 and the electrode portion 3 which are formed in a predetermined pattern, the solder paste composition is printed in accordance with the pattern.

Then, the electronic component 4 is mounted on the substrate 1 after being printed, and the substrate 1 is subjected to reflow at a temperature of 230° C. to 260° C. According to the reflow, the electronic circuit substrate 100, in which the solder-joined body 10 including the solder joint 6 and the flux residue 7 is formed on the substrate 1, and the substrate 1 and the electronic component 4 are electrically connected to each other, is prepared.

In addition, an electronic control device (an electronic device) of this embodiment is prepared through integration of the electronic circuit substrate 100 and mounting of the electronic component 4.

EXAMPLES

Hereinafter, the embodiment will be described with reference to examples and comparative examples. Note that the invention is not limited to the examples.

Preparation of Flux

Flux according to the examples and the comparative examples was obtained by kneading the following components.

Hydrogenated acid-modified rosin (product name: KE-604, manufactured by Arakawa Chemical Industries, Ltd.): 51% by weight Hardened castor oil: 6% by weight
Dodecane diacid (product name: SL-12, manufactured by OKAMURA OIL MILL CO., LTD): 10% by weight
Malonic acid: 1% by weight
Diphenylguanidine hydrobromate: 2% by weight
Hindered phenol-based antioxidant (product name: IRGANOX 245, manufactured by BASF JAPAN): 1% by weight
Diethylene glycol monohexyl ether: 29% by weight Preparation of Solder Paste Composition 11.0% by weight of flux described above, and 89.0% by weight of powder (powder particle size: 20 μm to 38 μm) of each lead-free solder alloy described in Table 1 and Table 2 were mixed with each other to prepare a solder paste composition according to each of Examples 1 to 24 and Comparative Examples 1 to 19.

|  | Sn | Ag | Cu | In | Sb | Ni | Co | Others |
|---|---|---|---|---|---|---|---|---|
| Example 1 | Balance | 3.0 | 0.5 | — | 3.0 | 0.03 | — | — |
| Example 2 | Balance | 3.0 | 0.5 | — | 3.5 | 0.03 | — | — |
| Example 3 | Balance | 3.0 | 0.5 | — | 4.0 | 0.03 | — | — |
| Example 4 | Balance | 3.0 | 0.5 | — | 5.0 | 0.03 | — | — |
| Example 5 | Balance | 1.0 | 0.5 | — | 3.0 | 0.03 | — | — |
| Example 6 | Balance | 1.0 | 0.5 | — | 5.0 | 0.03 | — | — |
| Example 7 | Balance | 4.0 | 0.5 | — | 3.0 | 0.03 | — | — |
| Example 8 | Balance | 4.0 | 0.5 | — | 5.0 | 0.03 | — | — |
| Example 9 | Balance | 3.0 | 1.0 | — | 3.0 | 0.03 | — | — |
| Example 10 | Balance | 3.0 | 1.0 | — | 5.0 | 0.03 | — | — |
| Example 11 | Balance | 3.0 | 0.7 | — | 4.0 | 0.01 | — | — |
| Example 12 | Balance | 3.0 | 0.7 | — | 4.0 | 0.25 | — | — |
| Example 13 | Balance | 3.0 | 0.7 | — | 4.0 | 0.03 | 0.001 | — |
| Example 14 | Balance | 3.0 | 0.7 | — | 4.0 | 0.03 | 0.008 | — |
| Example 15 | Balance | 3.0 | 0.7 | — | 4.0 | 0.03 | 0.25 | — |
| Example 16 | Balance | 3.0 | 0.5 | 3.0 | 4.0 | 0.03 | 0.008 | — |
| Example 17 | Balance | 3.0 | 0.5 | 6.0 | 4.0 | 0.03 | 0.008 | — |
| Example 18 | Balance | 3.0 | 0.5 | — | 4.0 | 0.03 | 0.008 | 0.05P |
| Example 19 | Balance | 3.0 | 0.5 | — | 4.0 | 0.03 | 0.008 | 0.05Ge |
| Example 20 | Balance | 3.0 | 0.5 | — | 4.0 | 0.03 | 0.008 | 0.05Ga |
| Example 21 | Balance | 3.0 | 0.5 | — | 4.0 | 0.03 | 0.008 | 0.05Fe |
| Example 22 | Balance | 3.0 | 0.5 | — | 4.0 | 0.03 | 0.008 | 0.05Mn |
| Example 23 | Balance | 3.0 | 0.5 | — | 4.0 | 0.03 | 0.008 | 0.05Cr |
| Example 24 | Balance | 3.0 | 0.5 | — | 4.0 | 0.03 | 0.008 | 0.05Mo |

TABLE 2

|  | Sn | Ag | Cu | In | Sb | Ni | Co | Others |
|---|---|---|---|---|---|---|---|---|
| Comparative Example1 | Balance | 3.0 | 0.5 | — | 0.5 | 0.03 | — | — |
| Comparative Example2 | Balance | 3.0 | 0.5 | — | 6.0 | 0.03 | — | — |
| Comparative Example3 | Balance | 0.5 | 0.5 | — | 3.0 | 0.03 | — | — |
| Comparative Example4 | Balance | 0.5 | 0.5 | — | 5.0 | 0.03 | — | — |
| Comparative Example5 | Balance | 4.5 | 0.5 | — | 3.0 | 0.03 | — | — |
| Comparative Example6 | Balance | 4.5 | 0.5 | — | 5.0 | 0.03 | — | — |
| Comparative Example7 | Balance | 3.0 | 1.5 | — | 3.0 | 0.03 | — | — |
| Comparative Example8 | Balance | 3.0 | 1.5 | — | 5.0 | 0.03 | — | — |
| Comparative Example9 | Balance | 3.0 | 0.5 | — | 4.0 | — | — | — |
| Comparative Example10 | Balance | 3.0 | 0.5 | — | 4.0 | 0.3 | — | — |
| Comparative Example11 | Balance | 3.0 | 0.5 | — | 4.0 | 0.03 | 0.3 | — |
| Comparative Example12 | Balance | 3.0 | 0.5 | 6.5 | 4.0 | 0.03 | 0.008 | — |
| Comparative Example13 | Balance | 3.0 | 0.5 | — | 4.0 | 0.03 | 0.008 | 0.1P |
| Comparative Example14 | Balance | 3.0 | 0.5 | — | 4.0 | 0.03 | 0.008 | 0.1Ge |
| Comparative Example15 | Balance | 3.0 | 0.5 | — | 4.0 | 0.03 | 0.008 | 0.1Ga |
| Comparative Example16 | Balance | 3.0 | 0.5 | — | 4.0 | 0.03 | 0.008 | 0.1Fe |
| Comparative Example17 | Balance | 3.0 | 0.5 | — | 4.0 | 0.03 | 0.008 | 0.1Mn |
| Comparative Example18 | Balance | 3.0 | 0.5 | — | 4.0 | 0.03 | 0.008 | 0.1Cr |
| Comparative Example19 | Balance | 3.0 | 0.5 | — | 4.0 | 0.03 | 0.008 | 0.1Mo |

(1) Solder Crack Test (−40° C. to 125° C.)

3.2 mm×1.6 mm Chip Component (Chip A)

A chip component (Ni/Sn plating) having a size of 3.2 mm×1.6 mm, a glass epoxy substrate including a solder resist having a pattern capable of mounting the chip component having the size, and an electrode (1.6 mm×1.2 mm) for connection of the chip component, and a metal mask having the same pattern and a thickness of 150 μm were prepared.

The solder paste composition was printed on the glass epoxy substrate by using the metal mask, and the chip component was mounted on the glass epoxy substrate.

The, the glass epoxy substrate was heated by using a reflow furnace (product name: TNP-538EM, manufactured by TAMURA Corporation) to form a solder joint that electrically connects the glass epoxy substrate and the chip component, and the chip component was mounted. As reflow conditions at this time, pre-heating was performed at 170° C. to 190° C. for 110 seconds, a peak temperature was set to 245° C., a period at which a temperature is maintained at 200° C. or higher was set to 65 seconds, a period at which a temperature is maintained at 220° C. or higher was set to 45 seconds, a cooling rate from the peak temperature to 200° C. was set to 3° C./second to 8° C./second, and an oxygen concentration was set to 1500±500 ppm.

Next, the glass epoxy substrate was exposed to an environment in which a thermal shock cycle is repeated 1,000 times, 1,500 times, 2,000 times, 2,500 times, and 3,000 times by using a thermal shock test apparatus (product name: ES-76LMS, manufactured by Hitachi Appliances, Inc.) under conditions of from −40° C. (for 30 minutes) to 125° C. (30 minutes), and then the glass epoxy substrate was taken out, thereby preparing each test substrate.

Then, a target portion of the test substrate was cut out, and was sealed with an epoxy resin (product name: EPO mount (main agent and curing agent), manufactured by Refine Tec Ltd.). In addition, a central cross-section of the chip component, which is mounted on the test substrate, was polished into a recognizable state by using a wet polisher (product name: TegraPol-25, manufactured by Marumoto Struers K.K.), and observation was made on whether or not a crack that occurred in the formed solder joint completely crossed the solder joint and it reached fracture by using a scanning electron microscope (product name: TM-1000, manufactured by Hitachi High-Technologies Corporation.), and evaluation was made on the basis of the following standard. Results are illustrated in Table 3 and Table 4. Furthermore, the number of evaluation chips in each thermal shock cycle was set to 10 pieces.

⊚: Crack, which completely crosses the solder joint, does not occur within 3,000 cycles ◯: Crack, which completely crosses the solder joint, occurred between 2,501 cycles to 3,000 cycles Δ: Crack, which completely crosses the solder joint, occurred between 2,001 cycles to 2,500 cycles ×: Crack, which completely crosses the solder joint, occurred before 2,000 cycles 2.0 mm×1.2 mm Chip Component (Chip B)

A test substrate was prepared under same conditions as in the chip component having a size of 3.2 mm×1.6 mm except that a chip component (Ni/Sn plating) having a size of 2.0 mm×1.2 mm, and a glass epoxy substrate including a solder resist having a pattern capable of mounting the chip component having the size, and an electrode (1.25 mm×1.0 mm) that connects the solder resist and the chip component were used, and evaluation was made by the same method as described above. Results are illustrated in Table 3 and Table 4.

(2) Solder Crack Test in Sn-Plated SON 1.3 mm pitch small outline non-leaded package (SON) component having a size of 6 mm×5 mm×0.8 mm (thickness) (the number of terminals: eight pins, product name: STL60N3LLH5, manufactured by STMicroelectronics), a glass epoxy substrate including a solder resist having a pattern capable of mounting the SON component, and an electrode (that conforms to a recommendation design of a maker) for connection of the SON component, and a metal mask having the same pattern and a thickness of 150 μm were prepared.

The solder paste composition was printed on the glass epoxy substrate by using the metal mask, and the SON component was mounted on the glass epoxy substrate. Then, a thermal shock was applied to the glass epoxy substrate under the same conditions as in the solder crack test (1) except that the glass epoxy substrate was placed under an environment in which the thermal shock cycle is repeated 1,000 times, 2,000 times, and 3,000 times, thereby preparing each test substrate.

Then, a target portion of the test substrate was cut out, and was sealed with an epoxy resin (product name: EPO mount (main agent and curing agent), manufactured by Refine Tec Ltd.). In addition, a central cross-section of the SON component, which is mounted on the test substrate, was polished into a recognizable state by using a wet polisher (product name: TegraPol-25, manufactured by Marumoto Struers K.K.), and observation was made on whether or not a crack that occurred in the formed solder joint completely crossed the solder joint and it reached fracture by using a scanning electron microscope (TM-1000, manufactured by Hitachi High-Technologies Corporation.). On the basis of the observation, evaluation was made on the solder joint as follows by classifying cracks into a crack that occurred in a solder base (in this specification, the solder base represents a portion other than an interface with an electrode of the SON component and the vicinity of the interface in the solder joint. The same shall apply hereinafter. In addition, the solder base is simply described as "base" in Table 3 and Table 4.), and a crack that occurred in the interface (intermetallic compound thereof) between the solder joint and the electrode of the SON component. Results are illustrated in Table 3 and Table 4. In addition, the number of the evaluation SON in each thermal shock cycle was set to 20 pieces, and one terminal of a gate electrode per one SON was observed to confirm a cross-section of a total of 20 terminals.

Crack that Occurs in Solder Base

⊚: Crack, which completely crosses the solder base, does not occur within 3,000 cycles ◯: Crack, which completely crosses the solder base, occurred between 2,001 cycles to 3,000 cycles Δ: Crack, which completely crosses the solder base, occurred between 1,001 cycles to 2,000 cycles ×: Crack, which completely crosses the solder base, occurred before 1,000 cycles Crack that Occurs in Interface Between Solder Joint and SON Component ⊚: Crack, which completely crosses the interface, does not occur within 3,000 cycles ◯: Crack, which completely crosses the interface, occurred between 2,001 cycles to 3,000 cycles Δ: Crack, which completely crosses the interface, occurred between 1,001 cycles to 2,000 cycles ×: Crack, which completely crosses the interface, occurred before 1,000 cycles (3) Solder Crack Test (−40° C. to 150° C.)

Since an in-vehicle substrate and the like are placed under a harsh environment in which a temperature difference is significant, a solder alloy that is used in the in-vehicle substrate is required to exhibit satisfactory crack propagation suppressing effect. Accordingly, a solder crack test in a temperature difference of −40° C. to 150° C. was performed by using a liquid bath type thermal shock test apparatus so as to clarify whether or not the solder alloy according to this embodiment can exhibit the effect even under the relatively harsh conditions. Conditions of the test are as follows.

First, a test substrate on which a chip component of 3.2×1.6 mm was mounted and a test substrate on which a chip component of 2.0×1.2 mm was mounted were prepared under the same conditions as in the solder crack test (1) except that each glass epoxy substrate after formation of the solder joint was exposed to an environment in which a thermal shock cycle is repeated 1,000 times, 2,000 times, and 3,000 times by using a liquid bath type thermal shock test apparatus (product name: ETAC WINTECH LT80, manufactured by Kusumoto Co., Ltd.) that was set to conditions of from −40° C. (for 5 minutes) to 150° C. (5 minutes).

Then, a target portion of the test substrate was cut out, and was sealed with an epoxy resin (product name: EPO mount (main agent and curing agent), manufactured by Refine Tec Ltd.). In addition, a central cross-section of the chip component, which is mounted on the test substrate, was polished into a recognizable state by using a wet polisher (product name: TegraPol-25, manufactured by Marumoto Struers K.K.), and observation was made on whether or not a crack that occurred in the formed solder joint completely crossed the solder joint and it reached fracture by using a scanning electron microscope (TM-1000, manufactured by Hitachi High-Technologies Corporation.), and evaluation was made on the basis of the following standard. Results are illustrated in Table 3 and Table 4. Furthermore, the number of evaluation chips in each thermal shock cycle was set to 10 pieces.

⊚: Crack, which completely crosses the solder joint, does not occur within 3,000 cycles ◯: Crack, which completely crosses the solder joint, occurred between 2,001 cycles to 3,000 cycles Δ: Crack, which completely crosses the solder joint, occurred between 1,001 cycles to 2,000 cycles ×: Crack, which completely crosses the solder joint, occurred before 1,000 cycles (4) Void Test A test substrate on which a chip component of 2.0×1.2 mm was mounted were prepared under the same conditions (without the thermal shock test) as in the solder crack test (1).

Figure 3:
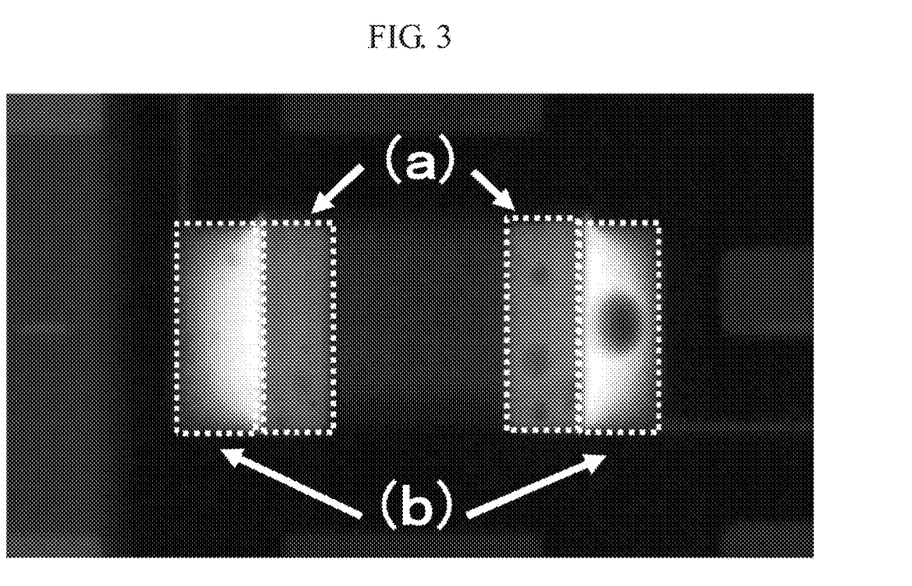
FIG. 3 is a photograph which illustrates a region under an electrode of a chip component and a region in which fillets were formed, and is obtained by capturing an image on a chip component side by using an X-ray transmission apparatus in test substrates according to an example and a comparative example of the invention.

Then, a surface state of each of the test substrate was observed with an X-ray transmission apparatus (product name: SMX-160E, manufactured by Shimadzu Corporation.) to obtain the average value of the area ratio (total void area ratio. The same shall apply hereinafter.) of voids that occupy regions (region (a) surrounded by a broken line in FIG. 3) under electrodes of chip components, and the area ratio of voids that occupy regions (region (b) surrounded by a broken line in FIG. 3) in which fillets were formed in 40 lands of each test substrate, and evaluation was made as follows. Results are illustrated in Table 3 and Table 4.

⊙: Average value of the area ratio of the voids was 3% or less, and the voids occurrence suppressing effect was very satisfactory ○: Average value of the area ratio of the voids was greater than 3% and equal to or less than 5%, and the voids occurrence suppressing effect was satisfactory Δ: Average value of the area ratio of the voids was greater than 5% and equal to or less than 8%, and the voids occurrence suppressing effect was sufficient x: Average value of the area ratio of the voids was greater than 8%, and the voids occurrence suppressing effect was not sufficient

TABLE 3

|  | Solder crack (−40° C.~125° C.) | | Sn-plated SON crack | | Solder crack (−40° C.~150° C.) | | Void | |
| --- | --- | --- | --- | --- | --- | --- | --- | --- |
|  | Chip A | Chip B | Base material | Interface | Chip A | Chip B | Under electrode | Fillet |
| Example1 | Δ | ○ | ○ | ○ | Δ | Δ | ○ | Δ |
| Example2 | ○ | ⊙ | ○ | ○ | Δ | Δ | ○ | Δ |
| Example3 | ⊙ | ⊙ | ⊙ | ○ | Δ | ○ | ○ | Δ |
| Example4 | ⊙ | ⊙ | ⊙ | ○ | Δ | ○ | ○ | Δ |
| Example5 | Δ | Δ | ○ | ○ | Δ | Δ | Δ | Δ |
| Example6 | Δ | ○ | ○ | ○ | Δ | Δ | Δ | Δ |
| Example7 | ○ | ○ | ○ | ○ | Δ | ○ | ○ | Δ |
| Example8 | ⊙ | ⊙ | ⊙ | ○ | Δ | ○ | ○ | Δ |
| Example9 | ○ | ○ | ○ | ○ | Δ | Δ | Δ | Δ |
| Example10 | ⊙ | ⊙ | ⊙ | ○ | Δ | ○ | Δ | Δ |
| Example11 | ⊙ | ⊙ | ⊙ | ○ | Δ | ○ | ○ | Δ |
| Example12 | ⊙ | ⊙ | ⊙ | ⊙ | Δ | Δ | Δ | Δ |
| Example13 | ⊙ | ⊙ | ⊙ | ○ | Δ | ○ | ○ | Δ |
| Example14 | ⊙ | ⊙ | ⊙ | ○ | ○ | ○ | ○ | Δ |
| Example15 | ⊙ | ⊙ | ⊙ | ⊙ | Δ | Δ | Δ | Δ |
| Example16 | ⊙ | ⊙ | ⊙ | ○ | ○ | ⊙ | Δ | Δ |
| Example17 | ⊙ | ⊙ | ⊙ | ○ | ○ | ⊙ | Δ | Δ |
| Example18 | ⊙ | ⊙ | ⊙ | ○ | ○ | ○ | ○ | Δ |
| Example19 | ⊙ | ⊙ | ⊙ | ○ | ○ | ○ | ○ | Δ |
| Example20 | ⊙ | ⊙ | ⊙ | ○ | ○ | ○ | ○ | Δ |
| Example21 | ⊙ | ⊙ | ⊙ | ○ | ○ | ○ | Δ | Δ |
| Example22 | ⊙ | ⊙ | ⊙ | ○ | ○ | ○ | ○ | Δ |
| Example23 | ⊙ | ⊙ | ⊙ | ○ | ○ | ○ | Δ | Δ |
| Example24 | ⊙ | ⊙ | ⊙ | ○ | ○ | ○ | Δ | Δ |

TABLE 4

|  | Solder crack (−40° C.~125° C.) | | Sn-plated SON crack | | Solder crack (−40° C.~150° C.) | | Void | |
| --- | --- | --- | --- | --- | --- | --- | --- | --- |
|  | Chip A | Chip B | Base material | Interface | Chip A | Chip B | Under electrode | Fillet |
| Comparative Example1 | X | Δ | Δ | ○ | X | X | ○ | ○ |
| Comparative Example2 | Δ | Δ | ○ | ○ | X | X | X | X |
| Comparative Example3 | X | Δ | Δ | ○ | X | X | X | X |
| Comparative Example4 | Δ | Δ | ○ | ○ | X | X | X | X |
| Comparative Example5 | Δ | Δ | ○ | ○ | X | X | X | Δ |
| Comparative Example6 | ○ | ○ | ○ | ○ | X | Δ | X | X |
| Comparative Example7 | Δ | Δ | ○ | ○ | X | X | X | X |
| Comparative Example8 | ○ | ○ | ○ | ○ | X | Δ | X | X |
| Comparative Example9 | ⊙ | ⊙ | ⊙ | X | Δ | Δ | ○ | ○ |

TABLE 4-continued

| | Solder crack (−40° C.~125° C.) | | Sn-plated SON crack | | Solder crack (−40° C.~150° C.) | | Void | |
|---|---|---|---|---|---|---|---|---|
| | Chip A | Chip B | Base material | Interface | Chip A | Chip B | Under electrode | Fillet |
| Comparative Example10 | Δ | ◯ | ◯ | ⊙ | X | Δ | Δ | X |
| Comparative Example11 | Δ | ◯ | ◯ | ⊙ | X | Δ | Δ | X |
| Comparative Example12 | Δ | Δ | ◯ | ◯ | X | Δ | X | Δ |
| Comparative Example13 | Δ | Δ | Δ | ◯ | X | X | X | X |
| Comparative Example14 | Δ | Δ | Δ | ◯ | X | X | X | X |
| Comparative Example15 | Δ | Δ | Δ | ◯ | X | X | X | X |
| Comparative Example16 | Δ | Δ | Δ | ◯ | X | X | X | X |
| Comparative Example17 | Δ | Δ | Δ | ◯ | X | X | X | X |
| Comparative Example18 | Δ | Δ | Δ | ◯ | X | X | X | X |
| Comparative Example19 | Δ | Δ | Δ | ◯ | X | X | X | X |

As described above, in the solder joint that is formed by using the lead-free solder alloy according to the examples, even under a harsh environment in which a temperature difference is significant and vibration is applied, even though Bi is not set as an essential composition, it is possible to exhibit the crack propagation suppressing effect in the solder joints and in the vicinity of the interfaces regardless of the chip size, and regardless of whether or not the electrode is subjected to Ni/Pd/Au plating or Ni/Au plating. Particularly, it can be seen that the solder joints of the examples exhibit satisfactory crack suppressing effect even under the harsh environment in which the temperature difference is set −40° C. to 150° C. by using the liquid bath type thermal shock test apparatus.

Particularly, in Example 13 to Example 24 in which Ni and Co are used in combination, it can be seen that it is possible to exhibit satisfactory crack propagation suppressing effect in the solder joint and in the vicinity of the interface.

In addition, even in a case where Ni or Co is contained in an amount of 0.25% by weight similar to Example 12 or Example 15, it is possible to suppress occurrence of voids in the fillets.

Accordingly, an electronic circuit substrate that is exposed to a significant temperature difference and includes the solder joint may be appropriately used as an electronic circuit such as an in-vehicle electronic circuit substrate for which high reliability is required. In addition, the electronic circuit substrate can be appropriately used in an electronic device for which further high reliability is required.

In a case of adding Bi to the solder alloy, Bi enters an arrangement lattice of atoms in the solder alloy, and substitutes for Sn, thereby deforming the arrangement lattice of atoms. According to this, a Sn matrix is strengthened and alloy strength is improved. Accordingly, a constant improvement in the solder crack propagation characteristics due to addition of Bi is expected.

However, there is a disadvantage that a stretching property of the lead-free solder alloy of which strength increases due to addition of Bi deteriorates, and brittleness of the lead-free solder alloy increases. When the present applicant solder-joined a substrate and a chip resistive component by using the lead-free solder alloy to which Bi is added in the related, and placed the resultant substrate under a harsh environment in which a temperature difference is significant, at the fillet portion on the chip resistive component side, a crack propagated in a linear shape from a direction at approximately 45° with respect to a longitudinal direction of the chip resistive component, and thus electrical short-circuiting occurred. Accordingly, particularly, in an in-vehicle substrate that is placed under a harsh environment in which a temperature difference is significant, the crack propagation suppressing effect is not sufficiently obtained by only an increase in strength due to addition of Bi and the like similar to the related art, and thus there is a demand for a new crack propagation suppressing method in addition to the increase in strength.

In addition, in a case of performing solder-joining by using an electronic component that is not subject to the Ni/Pd/Au plating or the Ni/Au plating, the $Cu_3Sn$ layer, which is an intermetallic compound, is greatly grown in a concavo-convex shape in the vicinity of the interface, and thus it is difficult to suppress crack propagation in the vicinity of the interface.

(1) A lead-free solder alloy according to the disclosure may contain 1% or more and weight to 4% by weight or less of Ag, 1% by weight or less of Cu, 3% by weight or more and 5% by weight or less of Sb, and 0.01% by weight or more and 0.25% by weight or less of Ni, and Sn.

(2) The lead-free solder alloy according to (1) may further contain 0.001% by weight or more and 0.25% by weight or less of Co.

(3) In the lead-free solder alloy according to (1) or (2), the amount of Sb may be 3.5% by weight or more and 5% by weight or less.

(4) Additionally, as another configuration of the disclosure, a lead-free solder alloy of the disclosure may contain 1% by weight or more and 4% by weight or less of Ag, 1% by weight or less of Cu, 3% by weight or more and 5% by weight or less of Sb, 0.01% by weight or more and 0.25% by weight or less of Ni, 0.001% by weight or more and 0.25% by weight or less of Co, and Sn, wherein inequalities (A) to (D) in terms of % by weight are satisfied, $1.6 \leq$ the amount of Ag+(the amount of Cu/0.5)$\leq 5.4$  (A)

$0.73 \leq$(the amount of Ag/4)+(the amount of Sb/5) $\leq 2.10$  (B)

$1.1 \leq$ the amount of Sb/the amount of Cu$\leq 11.9$  (C)

$0<$(the amount of Ni/0.25)+(the amount of Co/0.25) $\leq 1.19$  (D)

(5) The lead-free solder alloy according to any one of (1) to (4) may further contain 6% by weight or less of In.

(6) The lead-free solder alloy according to any one of (1) to (5) may further contain 0.001% by weight or more and 0.05% by weight or less of at least one of P, Ga, and Ge.

(7) The lead-free solder alloy according to any one of (1) to (6) may further contain 0.001% by weight or more and 0.05% by weight or less of at least one of Fe, Mn, Cr, and Mo.

(8) According to still another aspect of the invention, there is provided an electronic circuit substrate including a solder joint to joint an electronic component with the lead-free solder alloy, the lead-free solder alloy according to any one of (1) to (7).

(9) An electronic device of the disclosure may include the electronic circuit substrate according to (8).

(10) A lead-free solder alloy may consist of 1% by weight or more and 4% by weight or less of Ag, 1% by weight or less of Cu, 3% by weight or more and 5% by weight or less of Sb, 0.01% by weight or more and 0.25% by weight or less of Ni, Sn and unavoidable impurities.

(11) The lead-free solder alloy according to (10) may further consist of 0.001% by weight or more and 0.25% by weight or less of Co.

(12) In the lead-free solder alloy according to (10), an amount of Sb may be 3.5% by weight or more and 5% by weight or less.

(13) In the lead-free solder alloy according to (11), an amount of Sb may be 3.5% by weight or more and 5% by weight or less.

(14) A lead-free solder alloy may consist of 1% by weight or more and 4% by weight or less of Ag, 1% by weight or less of Cu, 3% by weight or more and 5% by weight or less of Sb, 0.01% by weight or more and 0.25% by weight or less of Ni, 0.001% by weight or more and 0.25% by weight or less of Co, Sn and unavoidable impurities, wherein inequalities (A) to (D) in terms of % by weight are satisfied, $1.6 \leq$ the amount of Ag+(the amount of Cu/0.5)$\leq 5.4$  (A)

$0.73 \leq$(the amount of Ag/4)+(the amount of Sb/5) $\leq 2.10$  (B)

$1.1 \leq$ the amount of Sb/the amount of Cu$\leq 11.9$  (C)

$0<$(the amount of Ni/0.25)+(the amount of Co/0.25) $\leq 1.19$  (D).

(15) The lead-free solder alloy according to (10) may further consist of 6% by weight or less of In.

(16) The lead-free solder alloy according to (11) may further consist of 6% by weight or less of In.

(17) The lead-free solder alloy according to (12) may further consist of 6% by weight or less of In.

(18) The lead-free solder alloy according to (13) may further consist of 6% by weight or less of In.

(19) The lead-free solder alloy according to (14) may further consist of 6% by weight or less of In.

(20) The lead-free solder alloy according to (10) may further consist of 0.001% by weight or more and 0.05% by weight or less of at least one of P, Ga, and Ge.

(21) The lead-free solder alloy according to (11) may further consist of 0.001% by weight or more and 0.05% by weight or less of at least one of P, Ga, and Ge.

(22) The lead-free solder alloy according to (13) may further consist of 0.001% by weight or more and 0.05% by weight or less of at least one of P, Ga, and Ge.

(23) The lead-free solder alloy according to (14) may further consist of 0.001% by weight or more and 0.05% by weight or less of at least one of P, Ga, and Ge.

(24) The lead-free solder alloy according to (10) may further consist of 0.001% by weight or more and 0.05% by weight or less of at least one of Fe, Mn, Cr, and Mo.

(25) The lead-free solder alloy according to (11) may further consist of 0.001% by weight or more and 0.05% by weight or less of at least one of Fe, Mn, Cr, and Mo.

(26) The lead-free solder alloy according to (13) may further consist of 0.001% by weight or more and 0.05% by weight or less of at least one of Fe, Mn, Cr, and Mo.

(27) The lead-free solder alloy according to (14) may further consist of 0.001% by weight or more and 0.05% by weight or less of or less at least one of Fe, Mn, Cr, and Mo.

(28) An electronic circuit substrate includes a solder joint to joint an electronic component with a lead-free solder alloy, the lead-free solder alloy consisting of 1% by weight or more and 4% by weight or less of Ag, 1% by weight or less of Cu, 3% by weight or more and 5% by weight or less of Sb, 0.01% by weight or more and 0.25% by weight or less of Ni, Sn, and unavoidable impurities.

(29) An electronic device includes the electronic circuit substrate according to (28).

According to the lead-free solder alloy of the disclosure, and the electronic circuit substrate and the electronic device which includes a solder joint that is formed by using the lead-free solder alloy, it is possible to suppress crack propagation in the solder joint even under a harsh environment in which a temperature difference is significant and vibration is applied, and it is possible to suppress crack propagation in the vicinity of an interface even in a case of performing solder-joining by using an electronic component that is not subjected to Ni/Pd/Au plating or Ni/Au plating.

Obviously, numerous modifications and variations of the present invention are possible in light of the above teachings. It is therefore to be understood that within the scope of the appended claims, the invention may be practiced otherwise than as specifically described herein.

What is claimed is:

1. A lead-free solder alloy consisting of:
   2% by weight or more and 4% by weight or less of Ag;
   0.5% by weight or more and 0.7% by weight or less of Cu;
   3% by weight or more and 5% by weight or less of Sb;
   0.01% by weight or more and 0.03% by weight or less of Ni; and Sn.

2. The lead-free solder alloy according to claim 1, wherein an amount of Sb is 3.5% by weight or more and 5% by weight or less.

3. A lead-free solder alloy consisting of:
   2% by weight or more and 4% by weight or less of Ag;
   0.5% by weight or more and 0.7% by weight or less of Cu;
   3% by weight or more and 5% by weight or less of Sb;
   0.01% by weight or more and 0.03% by weight or less of Ni;
   0.001% by weight or more and 0.008% by weight or less of Co; and Sn, wherein inequalities (A) to (D) in terms of % by weight are satisfied, $$1.6 \leq \text{an amount of Ag} + (\text{an amount of Cu}/0.5) \leq 5.4 \quad (A)$$

$$0.73 \leq (\text{an amount of Ag}/4) + (\text{an amount of Sb}/5) \leq 2.10 \quad (B)$$

$$1.1 \leq \text{an amount of Sb}/\text{an amount of Cu} \leq 11.9 \quad (C)$$

$$0 < (\text{an amount of Ni}/0.25) + (\text{an amount of Co}/0.25) \leq 1.19 \quad (D).$$

4. The lead-free solder alloy according to claim 3, wherein an amount of Sb is 3.5% by weight or more and 5% by weight or less.

5. An electronic circuit substrate comprising:
a solder joint to joint an electronic component with a lead-free solder alloy, the lead-free solder alloy consisting of:
2% by weight or more and 4% by weight or less of Ag;
0.5% by weight or more and 0.7% by weight or less of Cu;
3% by weight or more and 5% by weight or less of Sb;
0.01% by weight or more and 0.03% by weight or less of Ni; and Sn.

6. An electronic device comprising:
the electronic circuit substrate according to claim 5.

7. The electronic circuit substrate according to claim 5, wherein an amount of Sb is 3.5% by weight or more and 5% by weight or less.

8. A lead-free solder alloy consisting of:
2% by weight or more and 4% by weight or less of Ag;
0.5% by weight or more and 0.7% by weight or less of Cu;
3% by weight or more and 5% by weight or less of Sb;
0.01% by weight or more and 0.03% by weight or less of Ni;
0.001% by weight or more and 0.008% by weight or less of Co; and Sn.

9. An electronic circuit substrate comprising:
a solder joint to joint an electronic component with a lead-free solder alloy, the lead-free solder alloy consisting of:
2% by weight or more and 4% by weight or less of Ag;
0.5% by weight or more and 0.7% by weight or less of Cu;
3% by weight or more and 5% by weight or less of Sb;
0.01% by weight or more and 0.03% by weight or less of Ni;
0.001% by weight or more and 0.008% by weight or less of Co; and Sn.

10. A lead-free solder alloy consisting of:
2% by weight or more and 4% by weight or less of Ag;
0.5% by weight or more and 0.7% by weight or less of Cu;
3% by weight or more and 5% by weight or less of Sb;
0.01% by weight or more and 0.03% by weight or less of Ni;
6% by weight or less of In; and
Sn.

11. A lead-free solder alloy consisting of:
2% by weight or more and 4% by weight or less of Ag;
0.5% by weight or more and 0.7% by weight or less of Cu;
3% by weight or more and 5% by weight or less of Sb;
0.01% by weight or more and 0.03% by weight or less of Ni;
0.001% by weight or more and 0.008% by weight or less of Co;
6% by weight or less of In; and
Sn, wherein
inequalities (A) to (D) in terms of % by weight are satisfied, $$1.6 \leq \text{an amount of Ag} + (\text{an amount of Cu}/0.5) \leq 5.4 \quad (A)$$

$$0.73 \leq (\text{an amount of Ag}/4) + (\text{an amount of Sb}/5) \leq 2.10 \quad (B)$$

$$1.1 \leq \text{an amount of Sb}/\text{an amount of Cu} \leq 11.9 \quad (C)$$

$$0 < (\text{an amount of Ni}/0.25) + (\text{an amount of Co}/0.25) \leq 1.19 \quad (D).$$

* * * * *